(12) United States Patent
Carnevali et al.

(10) Patent No.: US 10,473,150 B2
(45) Date of Patent: Nov. 12, 2019

(54) MOUNTING ARRANGEMENT FOR ATTACHMENT TO DEVICE SOCKETS AND METHODS OF MAKING AND USING

(71) Applicant: National Products, Inc., Seattle, WA (US)

(72) Inventors: Jeffrey D. Carnevali, Seattle, WA (US); Stefan Michael Gottschalk, Seattle, WA (US)

(73) Assignee: NATIONAL PRODUCTS, INC., Seattle, WA (US)

( * ) Notice: Subject to any disclaimer, the term of this patent is extended or adjusted under 35 U.S.C. 154(b) by 0 days.

(21) Appl. No.: 15/955,314

(22) Filed: Apr. 17, 2018

(65) Prior Publication Data

US 2019/0316628 A1    Oct. 17, 2019

(51) Int. Cl.
| F16M 11/00 | (2006.01) |
| F16C 11/06 | (2006.01) |
| F16B 2/04 | (2006.01) |
| F16B 2/14 | (2006.01) |
| H05K 5/02 | (2006.01) |
| F16M 13/02 | (2006.01) |

(52) U.S. Cl.
CPC ........... F16C 11/0695 (2013.01); F16B 2/04 (2013.01); F16B 2/14 (2013.01); F16C 11/0685 (2013.01); F16M 13/022 (2013.01); H05K 5/0204 (2013.01); F16M 2200/024 (2013.01)

(58) Field of Classification Search
CPC .. B60R 11/02; B60R 11/0241; F16C 11/0604; F16M 13/022; F16M 13/00
See application file for complete search history.

(56) References Cited

U.S. PATENT DOCUMENTS

| 180,881 A | 8/1876 | Howson |
| 538,534 A | 4/1895 | Neill |
| 596,729 A | 1/1898 | White |
| 842,007 A | 1/1907 | Parker |
| 855,149 A | 5/1907 | Vaughn et al. |

(Continued)

OTHER PUBLICATIONS

Yakattack.us, 7 pages of product description of GearTrac retrieved from web site at: www.yakattack.us/by-product-name/geartrac/.

(Continued)

*Primary Examiner* — Amy J. Sterling
(74) *Attorney, Agent, or Firm* — Lowe Graham Jones PLLC; Bruce E. Black

(57) ABSTRACT

A mounting arrangement for coupling to a device having a pair of sockets includes a mount having a base, a ball, and a neck coupling the ball to the base; two device engagement units, each of the device engagement units having a receiving platform and a leg extending from the receiving platform, each of the legs of the two device engagement units having a male socket engagement element to engage one of the sockets of the device; and two fasteners to fasten the mount to the two device engagement units. The mounting arrangement is configured for the base to be received by, and fastened to, both of the receiving platforms of the two device engagement units and for the base to form a wedge pushing the male socket engagement elements into engagement with the sockets of the device to non-rotatably secure the mounting arrangement to the device.

20 Claims, 7 Drawing Sheets

(56) References Cited

U.S. PATENT DOCUMENTS

| | | | |
|---|---|---|---|
| 890,656 A | 6/1908 | Johnson | |
| 892,105 A | 6/1908 | White | |
| 958,052 A | 5/1910 | Williams | |
| 1,009,913 A | 11/1911 | Maguire et al. | |
| 1,280,013 A | 9/1918 | Goddard | |
| 1,359,645 A | 11/1920 | Zink | |
| 1,455,441 A | 5/1923 | Hodny | |
| 1,509,068 A | 9/1924 | Herron | |
| 1,934,223 A | 11/1933 | Booth | |
| 2,029,089 A | 1/1936 | Weirauch | |
| 2,114,767 A | 4/1938 | Hodny et al. | |
| 2,121,317 A | 6/1938 | Cohen | |
| D142,057 S | 8/1945 | Baxter | |
| 2,533,867 A * | 12/1950 | Zink | B60R 1/078 248/276.1 |
| 2,560,556 A | 7/1951 | Creedon | |
| 2,752,173 A | 6/1952 | Krooss | |
| 2,650,788 A | 9/1953 | Hulstein | |
| 2,688,504 A | 9/1954 | Parker | |
| 2,710,609 A | 6/1955 | Giller | |
| 2,723,823 A | 11/1955 | Polk | |
| 2,859,710 A | 11/1958 | Elsner | |
| 2,861,501 A | 11/1958 | Strelakos | |
| 3,096,061 A | 7/1963 | Bertell | |
| 3,252,677 A | 5/1966 | Raymond | |
| 3,304,038 A | 2/1967 | Guthrie | |
| 3,605,637 A | 9/1971 | Prete, Jr. | |
| 3,652,050 A | 3/1972 | Marrujo et al. | |
| 3,779,502 A | 12/1973 | Marberg | |
| 3,843,272 A | 10/1974 | Jorn | |
| 4,060,241 A | 11/1977 | Hegel | |
| 4,060,331 A | 11/1977 | Domer et al. | |
| 4,066,231 A | 1/1978 | Bahner | |
| 4,066,311 A | 1/1978 | Poulson | |
| D247,420 S | 3/1978 | Reynolds | |
| 4,085,684 A | 4/1978 | McLennan et al. | |
| 4,183,387 A | 1/1980 | Lenz | |
| 4,205,486 A | 6/1980 | Guarnacci | |
| 4,222,680 A | 9/1980 | Browning | |
| 4,225,258 A | 9/1980 | Thompson | |
| 4,307,864 A | 12/1981 | Benoit | |
| 4,461,284 A | 7/1984 | Fackler | |
| 4,491,435 A | 1/1985 | Meier | |
| 4,585,197 A | 4/1986 | Liautaud et al. | |
| 4,611,839 A | 9/1986 | Rung et al. | |
| 4,620,813 A | 11/1986 | Lacher | |
| 4,641,986 A | 2/1987 | Tsui et al. | |
| 4,677,794 A | 7/1987 | Parron et al. | |
| 4,688,843 A | 8/1987 | Hall | |
| 4,796,508 A | 1/1989 | Hoshino | |
| 4,800,795 A | 1/1989 | Yamashita | |
| 4,805,784 A | 2/1989 | Solheim et al. | |
| 4,842,308 A | 6/1989 | Spotts | |
| 4,872,630 A | 10/1989 | Cooper | |
| 4,950,099 A | 8/1990 | Roellin | |
| 5,071,279 A | 12/1991 | Rustrom | |
| 5,092,551 A | 3/1992 | Meier | |
| 5,109,321 A | 4/1992 | Maglica et al. | |
| 5,118,058 A | 6/1992 | Richter | |
| 5,241,796 A | 9/1993 | Hellwig et al. | |
| 5,251,859 A | 10/1993 | Cyrell et al. | |
| 5,259,711 A | 11/1993 | Beck | |
| 5,270,911 A | 12/1993 | Maglica et al. | |
| 5,284,098 A | 2/1994 | Klapperich et al. | |
| 5,305,700 A | 4/1994 | Strong et al. | |
| 5,419,522 A | 5/1995 | Luecke et al. | |
| 5,441,225 A | 8/1995 | Hall | |
| 5,564,668 A | 10/1996 | Crowe, II | |
| 5,628,597 A | 5/1997 | Chudoba et al. | |
| 5,727,858 A | 3/1998 | Shapiro | |
| 5,823,724 A | 10/1998 | Lee | |
| 5,845,885 A | 12/1998 | Carnevali | |
| 6,173,926 B1 | 1/2001 | Elvegaard | |
| 6,308,642 B1 | 10/2001 | Branam et al. | |
| 6,561,476 B2 | 5/2003 | Carnevali | |
| 6,581,892 B2 | 6/2003 | Carnevali | |
| 6,588,722 B2 | 7/2003 | Eguchi et al. | |
| 6,666,420 B1 | 12/2003 | Carnevali | |
| 6,688,568 B1 | 2/2004 | Moufflet | |
| 6,695,183 B2 | 2/2004 | Hancock et al. | |
| 6,789,988 B1 | 9/2004 | Moradians | |
| 6,846,140 B2 | 1/2005 | Anderson et al. | |
| 6,902,089 B2 | 6/2005 | Carnevali | |
| 6,945,414 B1 | 9/2005 | Stevens et al. | |
| 7,090,181 B2 | 8/2006 | Biba et al. | |
| 7,100,808 B2 | 9/2006 | Hancock et al. | |
| 7,159,998 B2 | 1/2007 | Moreland | |
| D539,639 S | 4/2007 | Nagle | |
| 7,277,240 B2 | 10/2007 | Carnevali | |
| 7,320,450 B2 | 1/2008 | Carnevali | |
| D563,781 S | 3/2008 | Carnevali | |
| D564,062 S | 3/2008 | Carnevali | |
| 7,337,934 B2 | 3/2008 | Alling et al. | |
| 7,401,995 B2 | 7/2008 | Senakiewich, II | |
| 7,422,184 B2 | 9/2008 | Carnevali | |
| D588,903 S | 3/2009 | Carnevali | |
| D589,327 S | 3/2009 | Carnevali | |
| D590,696 S | 4/2009 | Carnevali | |
| 7,523,904 B2 | 4/2009 | Carnevali | |
| 7,551,458 B2 | 6/2009 | Carnevali | |
| 7,556,463 B1 | 7/2009 | Hall | |
| 7,571,522 B2 | 8/2009 | Carnevali | |
| 7,607,622 B2 | 10/2009 | Carnevali | |
| 7,682,543 B2 | 3/2010 | Carnevali | |
| 7,731,140 B2 | 6/2010 | Carnevali | |
| 7,774,973 B2 | 8/2010 | Carnevali | |
| D629,080 S | 12/2010 | Dole et al. | |
| 7,849,630 B2 | 12/2010 | Carnevali | |
| 7,850,133 B2 | 12/2010 | Carnevali | |
| 7,854,204 B2 | 12/2010 | Dacus | |
| RE42,060 E | 1/2011 | Carnevali | |
| 7,887,018 B2 | 2/2011 | Carnevali | |
| 7,950,701 B2 | 5/2011 | Dole et al. | |
| 7,954,773 B2 | 6/2011 | Carnevali | |
| 7,975,971 B2 | 7/2011 | Carnevali | |
| 7,980,798 B1 | 7/2011 | Kuehn et al. | |
| RE42,581 E | 8/2011 | Carnevali | |
| 7,988,106 B2 | 8/2011 | Carnevali | |
| 8,020,828 B2 | 9/2011 | Carnevali | |
| 8,037,904 B2 | 10/2011 | Carnevali | |
| 8,156,681 B2 | 4/2012 | Carnevali | |
| 8,201,788 B2 | 6/2012 | Carnevali | |
| 8,235,340 B2 | 8/2012 | Carnevali | |
| RE43,806 E | 11/2012 | Carnevali | |
| 8,322,955 B2 | 12/2012 | Arnesen et al. | |
| 8,408,853 B2 | 4/2013 | Womack et al. | |
| 8,454,178 B2 | 6/2013 | Carnevali | |
| 8,505,861 B2 | 8/2013 | Carnevali | |
| 8,534,519 B2 | 9/2013 | Hancock et al. | |
| 8,590,855 B2 | 11/2013 | Carnevali | |
| 8,651,289 B2 | 2/2014 | Diaz, Jr. et al. | |
| 8,776,698 B2 | 7/2014 | Pherson | |
| 8,992,238 B2 | 3/2015 | Chinn | |
| 9,056,580 B2 | 6/2015 | Baldsiefen et al. | |
| 9,180,925 B2 | 11/2015 | Carnevali | |
| 9,253,970 B2 | 2/2016 | Carnevali | |
| 9,365,150 B2 | 6/2016 | Baldsiefen et al. | |
| 9,379,504 B2 | 6/2016 | Chinn | |
| 9,568,148 B2 * | 2/2017 | Carnevali | B60R 11/0241 |
| 9,623,787 B2 | 4/2017 | Sterling | |
| 9,671,060 B1 | 6/2017 | Cifers | |
| 9,828,073 B1 | 11/2017 | Cifers, III | |
| 9,944,217 B2 | 4/2018 | Schroeder et al. | |
| 9,975,466 B2 | 5/2018 | Hendren et al. | |
| 9,987,993 B2 | 6/2018 | Thorimbert | |
| 2002/0166935 A1 * | 11/2002 | Carnevali | F16C 11/0604 248/276.1 |
| 2003/0042282 A1 | 3/2003 | Gates et al. | |
| 2003/0185008 A1 | 10/2003 | Moreland | |
| 2004/0178309 A1 | 9/2004 | Crowley et al. | |
| 2004/0262479 A1 * | 12/2004 | Jopling | B60R 11/02 248/309.1 |
| 2005/0036848 A1 | 2/2005 | Cunningham et al. | |
| 2005/0092876 A1 | 5/2005 | Carnevali | |

(56) References Cited

U.S. PATENT DOCUMENTS

| | | |
|---|---|---|
| 2005/0132937 A1 | 6/2005 | Branam |
| 2006/0000957 A1 | 1/2006 | Carnevali |
| 2006/0102823 A1 | 5/2006 | Carnevali |
| 2008/0115344 A1 | 5/2008 | Carnevali |
| 2008/0296334 A1 | 12/2008 | Carnevali |
| 2009/0014584 A1 | 1/2009 | Ruddock et al. |
| 2009/0095206 A1 | 4/2009 | Dacus |
| 2009/0108151 A1 | 4/2009 | Carnevali |
| 2009/0108152 A1 | 4/2009 | Carnevali |
| 2009/0140112 A1 | 6/2009 | Carnevali |
| 2009/0241293 A1 | 10/2009 | Swerdlick |
| 2010/0282802 A1 | 11/2010 | Carnevali |
| 2010/0284199 A1 | 11/2010 | Carnevali |
| 2010/0288843 A1 | 11/2010 | Arnesen et al. |
| 2011/0097177 A1 | 4/2011 | Carnevali |
| 2012/0006948 A1 | 1/2012 | Hiss et al. |
| 2012/0181409 A1 | 7/2012 | Hayahara et al. |
| 2012/0217353 A1 | 8/2012 | Hennon |
| 2012/0318937 A1 | 12/2012 | Carnevali |
| 2013/0133158 A1 | 5/2013 | Tran |
| 2014/0003878 A1 | 1/2014 | Knox et al. |
| 2014/0034794 A1 | 2/2014 | Carnevali |
| 2014/0226315 A1 | 8/2014 | Nicieja et al. |
| 2014/0248103 A1 | 9/2014 | Baldsiefen et al. |
| 2015/0030386 A1 | 1/2015 | Carnevali |
| 2015/0275942 A1 | 10/2015 | Carnevali |
| 2016/0288691 A1 | 10/2016 | Aubrey et al. |
| 2017/0209318 A1 | 7/2017 | Schroeder et al. |

OTHER PUBLICATIONS

Yakattack.us, 4 pages of product description of GTTL retrieved from web site at: www.yakattack.us/geartrac/gttl/.

Yakattack.us, 6 pages of product description of GTSL90 retrieved from web site at: www.yakattack.us/by-product-name/geartrac/gtsl90/.

Yakattack.us, 5 pages of product description of GT90 retrieved from web site at: www.yakattack.us/geartrac/gt90/.

Yakattack.us, 4 pages of product description of GT175 retrieved from web site at: www.yakattack.us/geartrac/gt175/.

U.S. Appl. No. 15/650,732, filed Jul. 14, 2017.
U.S. Appl. No. 15/612,764, filed Jun. 2, 2017.
U.S. Appl. No. 15/627,102, filed Jun. 19, 2017.
U.S. Appl. No. 15/650,726, filed Jul. 14, 2017.
U.S. Appl. No. 15/612,798, filed Jun. 2, 2017.

* cited by examiner

US 10,473,150 B2

MOUNTING ARRANGEMENT FOR ATTACHMENT TO DEVICE SOCKETS AND METHODS OF MAKING AND USING

FIELD

The present invention is directed to mounting arrangements to attach to sockets in a device. The present invention is also directed to mounting arrangements having a wedge-like base to drive engagement members into sockets of a device.

BACKGROUND

Providing mounts for holding, retaining, or securing objects has proven beneficial for many different uses. Some mountable-objects, such as electronic devices (e.g., phones, laptops, tablets, visual-enhancement devices, positioning devices, or the like), or manual-activity-based objects (e.g., cylindrical elements, oars, or the like) are increasingly used in situations where mounting the object to a surface increases the convenience of using the object. For example, mounts may eliminate the need to hold an object, or prop the device up, in order to use the object, thereby allowing a user to use the object more efficiently, or while simultaneously engaging in other activities which may benefit from the use of both hands without the encumberment of holding or propping-up the object. In some instances, mounting an object may increase user safety by enabling use of the object, without the distraction of holding the object.

BRIEF SUMMARY

One embodiment is a mounting arrangement for coupling to a device having a pair of sockets. The mounting arrangement includes a mount having a base, a ball, and a neck coupling the ball to the base; two device engagement units, each of the device engagement units having a receiving platform and a leg extending from the receiving platform, each of the legs of the two device engagement units having a male socket engagement element configured to engage a different one of the sockets of the device; and two fasteners, each fastener configured to fasten the mount to a different one of the two device engagement units. The mounting arrangement is configured for the base to be received by, and fastened to, both of the receiving platforms of the two device engagement units and for the base to form a wedge pushing the male socket engagement elements of the two device engagement units into engagement with the sockets of the device to non-rotatably secure the mounting arrangement to the device.

In at least some embodiments, the receiving platforms of the two device engagement units combine to form an inset receiving surface for the base of the mount. In at least some embodiments, the two device engagement units further include a rim around a perimeter of the inset receiving surface. In at least some embodiments, the base and the inset receiving surface are both diamond-shaped. In at least some embodiments, a height of the rim above the inset receiving surface is equal to or less than an average thickness of the base. In at least some embodiments, a height of the rim above the inset receiving surface is equal to or greater than an average thickness of the base.

In at least some embodiments, the receiving platform of at least one of the device engagement units includes a tab and the receiving platform of at least one of the device engagement units includes a recess configured to receive the tab. In at least some embodiments, the male socket engagement element includes a plurality of teeth configured to engage and alternate with teeth of the sockets of the device. In at least some embodiments, the teeth are distributed around a portion of a perimeter of the male socket engagement element.

In at least some embodiments, each of the device engagement units includes a housing, an opening into the housing, and a nut disposed within the housing and configured to receive a one of the fasteners. In at least some embodiments, the mount includes two openings and each of the device engagement units includes an opening in the receiving platform for alignment with one of the openings in the mount and for receiving a one of the fasteners. In at least some embodiments, the ball includes a resilient surface.

Another embodiment is a mounting arrangement for coupling to a device having a pair of sockets with teeth. The mounting arrangement includes a mount having a base and a ball coupled to the base; and two device engagement units, each of the device engagement units including a male socket engagement element with a plurality of teeth configured to engage at least a portion of the teeth of one of the sockets of the device. The mounting arrangement is configured for the base to be fastened to both of the two device engagement units and for the base to form a wedge pushing the male socket engagement elements of the two device engagement units into engagement with the sockets of the device to non-rotatably secure the mounting arrangement to the device.

In at least some embodiments, each of the device engagement units includes a receiving platform configured for receiving and coupling to the base of the mount. In at least some embodiments, the receiving platforms of the two device engagement units combine to form an inset receiving surface for the base of the mount. In at least some embodiments, the two device engagement units further include a rim around a perimeter of the inset receiving surface.

Another embodiment is a method of attaching any of the mounting arrangement described above to a device having a pair of sockets. The method includes inserting the male socket engagement element of a first one of the two device engagement units into a one of the sockets of the device; inserting the male socket engagement element of a second one of the two device engagement units into another one of the sockets of the device; and coupling the base of the mount of to the receiving platforms of the two device engagement units to form the wedge pushing the male socket engagement elements of the two device engagement units into engagement with the sockets of the device to non-rotatably secure the mounting arrangement to the device.

In at least some embodiments, the receiving platform of at least one of the device engagement units includes a tab and the receiving platform of at least one of the device engagement units includes a recess configured to receive the tab, wherein the method further includes forming a receiving surface from the receiving platforms of the two device engagement units by aligning the receiving platforms so that the tab is received in the recess.

In at least some embodiments, the mount includes two openings and each of the device engagement units includes an opening in the receiving platform for alignment with one of the openings in the mount and for receiving a one of the fasteners, wherein coupling the base of the mount includes inserting the two fasteners respectively through the openings in the mount and the receiving platforms.

In at least some embodiments, each of the device engagement units includes a housing, an opening into the housing, and a nut disposed within the housing, wherein inserting the two fasteners further includes engaging each fastener with the nut in one of the device engagement units.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description, which is to be read in association with the accompanying drawings, wherein.

DETAILED DESCRIPTION

The present invention is directed to mounting arrangements to attach to sockets in a device. The present invention is also directed to mounting arrangements having a wedge-like base to drive engagement members into sockets of a device.

Figure 1:
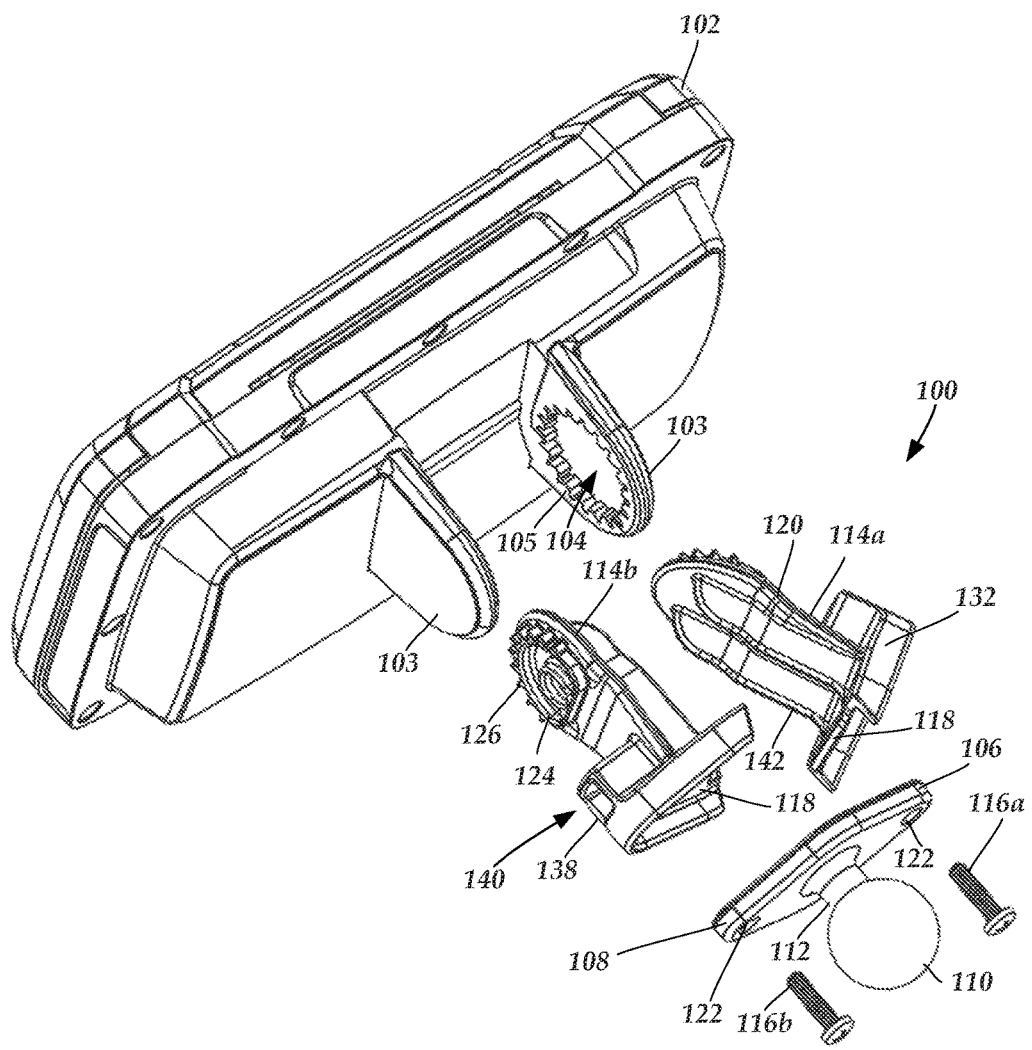
FIG. 1 is a schematic perspective, exploded view of one embodiment of a mounting arrangement and a device to which the mounting arrangement is to be attached, according to the invention.

FIG. 1 illustrates a mounting arrangement 100 for mounting to a device 102 with two socket members 103 each defining a socket 104. The device 102 can be any suitable device including, but not limited to, mobile devices such as, for example, mobile phones, tablets, electronic fish finders, and the like. The socket members 103 can be an integral part of the device 102 or can be attached to the device as an accessory, part of a case for the device, or as any other component or portion of a component associated with the device. In some embodiments, the socket members 103 may be part of a case for the device or optionally may be included as part of the mounting arrangement 100.

Each of the socket members 103 extends away from a remainder of the device 102 and defines teeth 105 or other engagement elements around the socket 104 that can engage corresponding elements on the mounting arrangement 100 to lock the mounting arrangement and the device 102 into a fixed position. In at least some embodiments, when the teeth 105 or other engagement elements are disengaged from the mounting arrangement 100, the device 102 and mounting arrangement can be repositioned relative to each other.

The mounting arrangement 100 includes a mount 106 with a base 108, a ball 110, and a neck 112 coupling the ball to the base. In at least some embodiments, the mounting arrangement 100 also includes two device engagement units 114a, 114b and two fasteners 116a, 116b to fasten the base 108 to the respective device engagement units. Each of the device engagement units 114a, 114b includes a receiving platform 118 for attachment of the base 108 and a leg 120 extending from the receiving platform. The leg 120 contains a male socket engagement element 124 arranged to engage the socket 104 of the device 102. In at least some embodiments, the male socket engagement element 124 include multiple teeth 126 or other engagement elements that are configured to engage the teeth 105 of the socket 104 of the device 102 in an interlocking arrangement to lock the mounting arrangement 100 and the device 102 into a fixed position and, preferably, to prevent rotation of the mounting arrangement 100 relative to the device 102 unless the male socket engagement elements 124 are disengaged from the sockets 104.

Figure 2A:
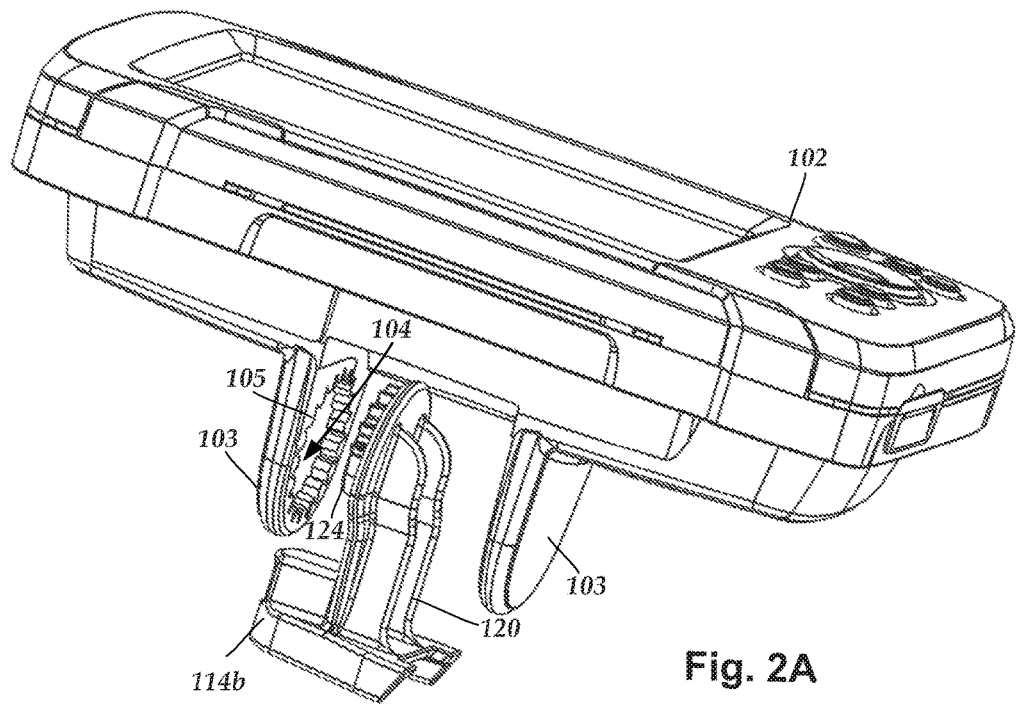
FIG. 2A is a schematic perspective view of a first device engagement unit of the mounting arrangement of FIG. 1 being presented to a socket of the device, according to the invention
Figure 2B:
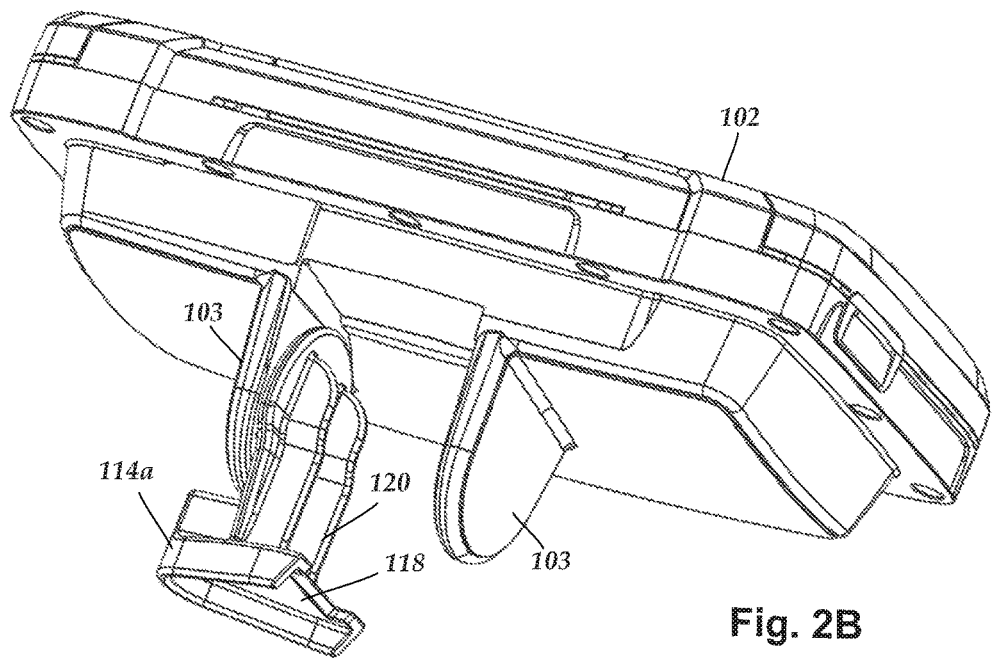
FIG. 2B is a schematic perspective view of a portion of the first device engagement unit inserted into the socket of the device, according to the invention.
Figure 2C:
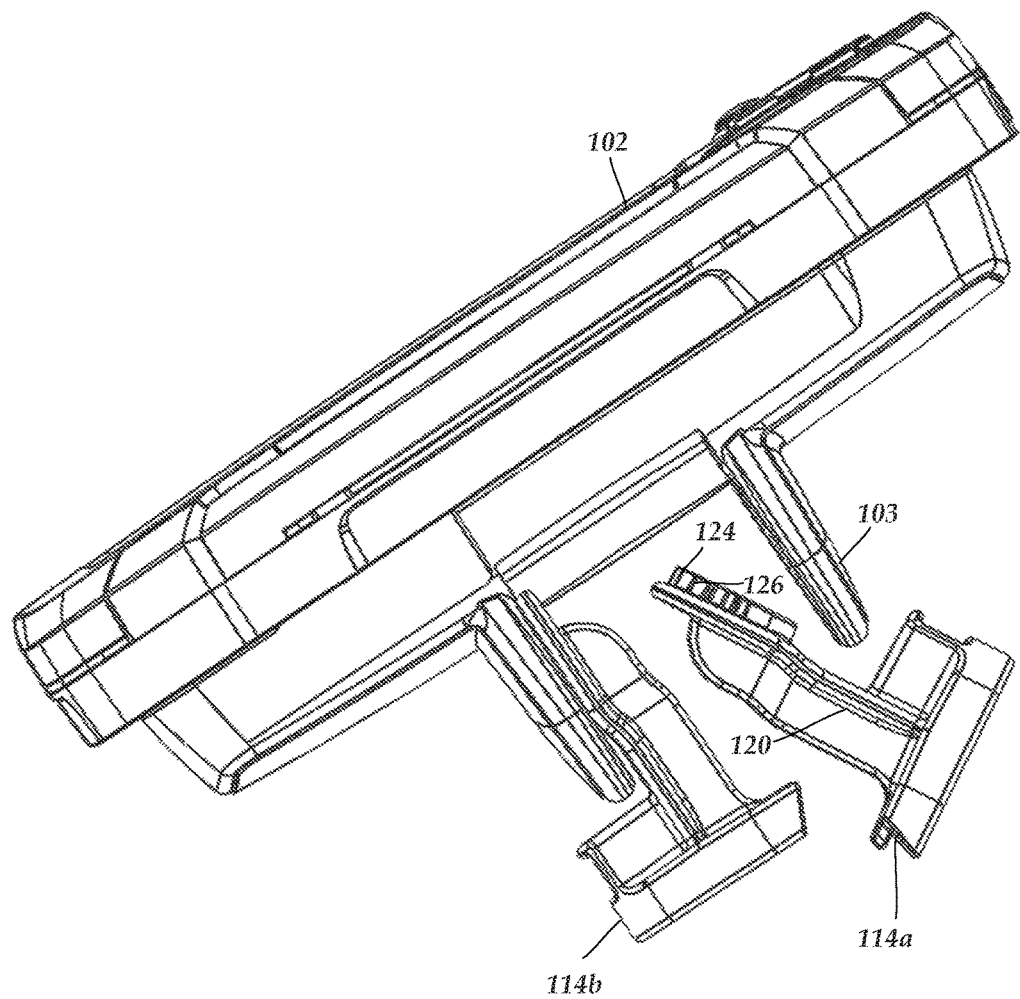
FIG. 2C is a schematic perspective view of a second device engagement unit of the mounting arrangement of FIG. 1 presented to another socket of the device, according to the invention.
Figure 2D:
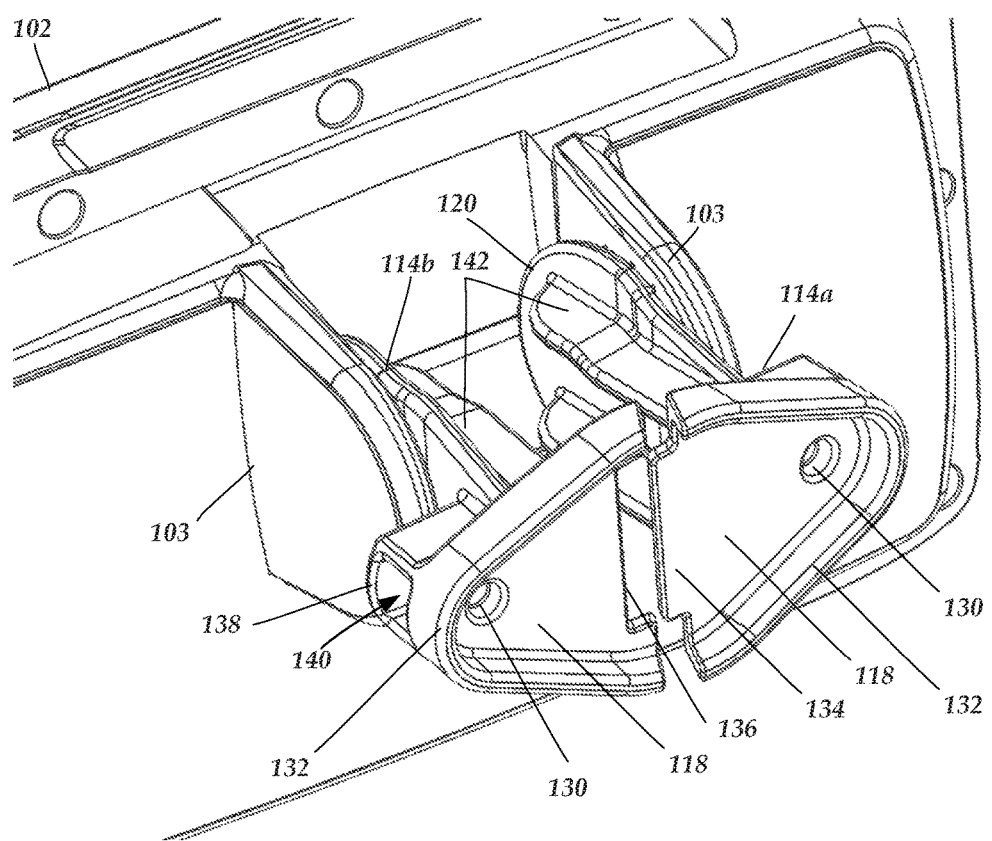
FIG. 2D is a schematic perspective view of a portion of the second device engagement unit inserted into the other socket of the device, according to the invention.

FIGS. 2A-2F illustrate one method of attaching the mounting arrangement 100 to the device 102. FIG. 2A illustrates a first device engagement unit 114b being presented to a socket 104 of the device 102. In FIG. 2B, the male socket engagement elements 124 of the first device engagement unit 114b is inserted into the socket 104. In FIG. 2C, the second device engagement unit 114a is presented to another socket 104 of the device 102. In FIG. 2D, the male socket engagement elements 124 of the second device engagement unit 114a is inserted into the other socket 104. The receiving platforms 118 of the device engagement units 114a, 114b can be fit together.

Figure 2E:
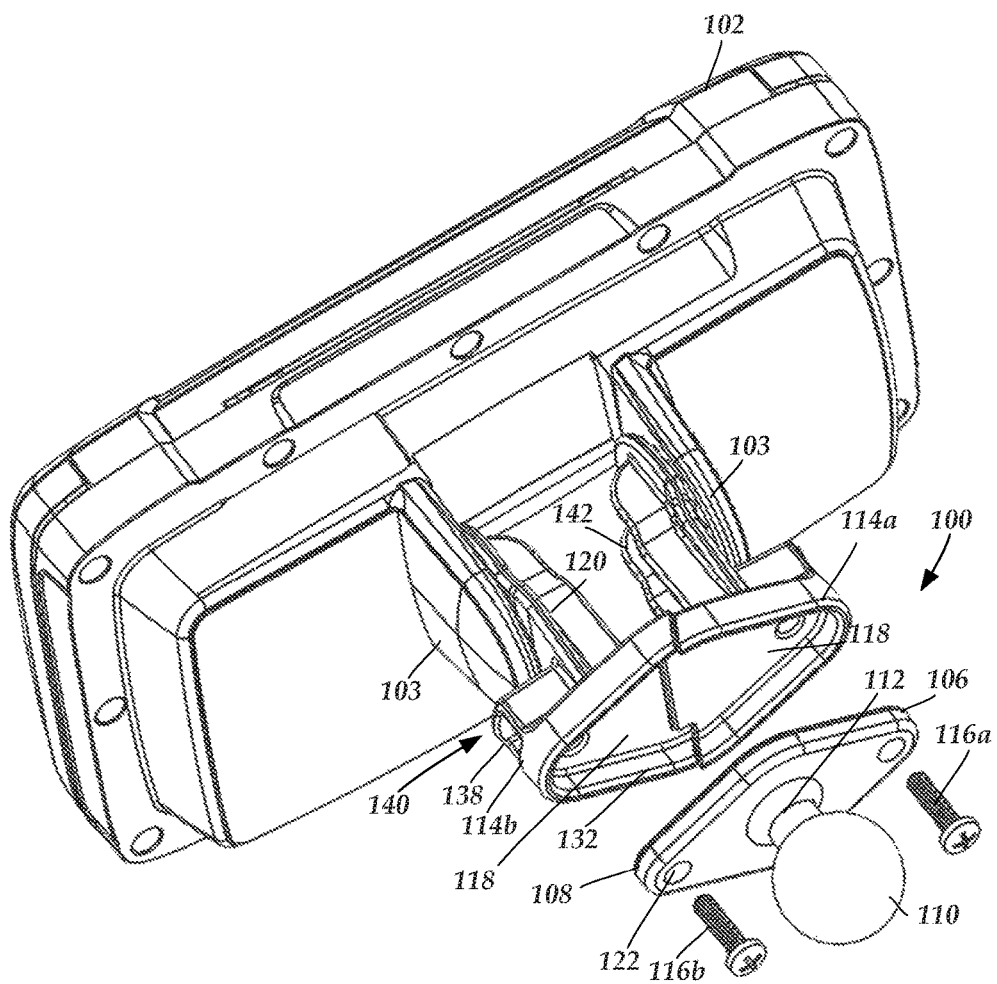
FIG. 2E is a schematic perspective view of a base of a mount of the mounting arrangement of FIG. 1 presented to combined receiving platforms of the two device engagement units, according to the invention.
Figure 2F:
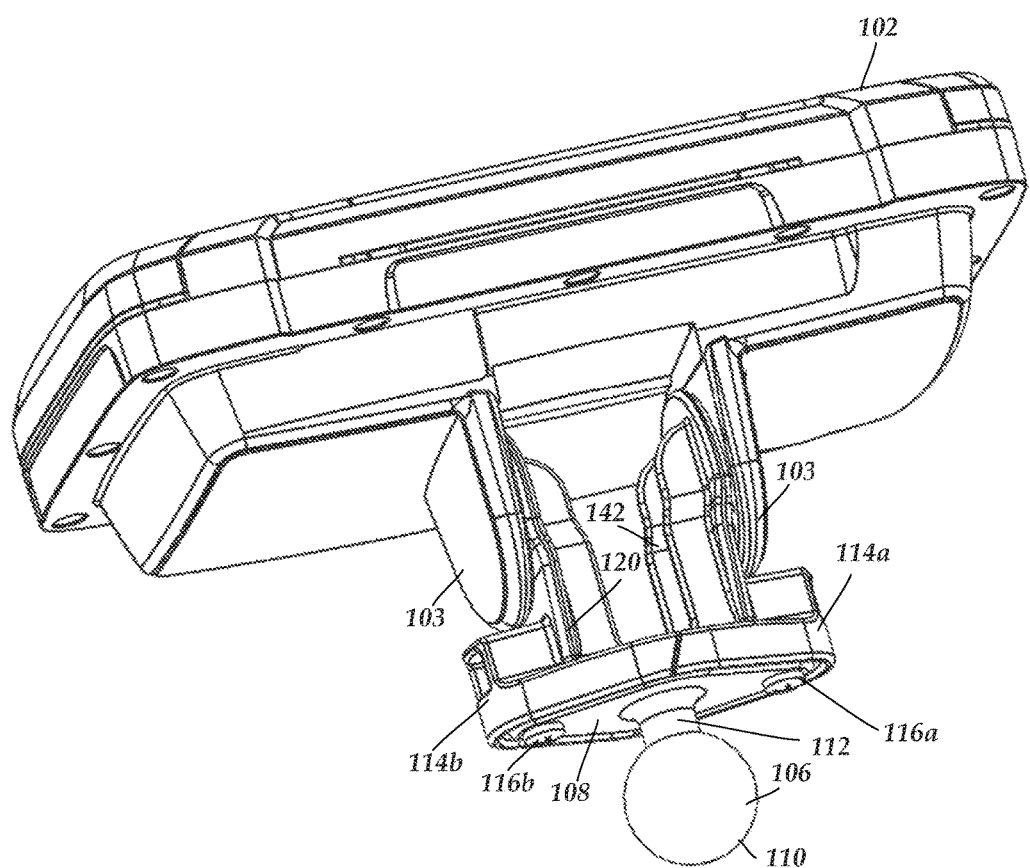
FIG. 2F is a schematic perspective view of the base attached to the combined receiving platforms of the two device engagement units using fasteners, according to the invention.
Figure 2G:
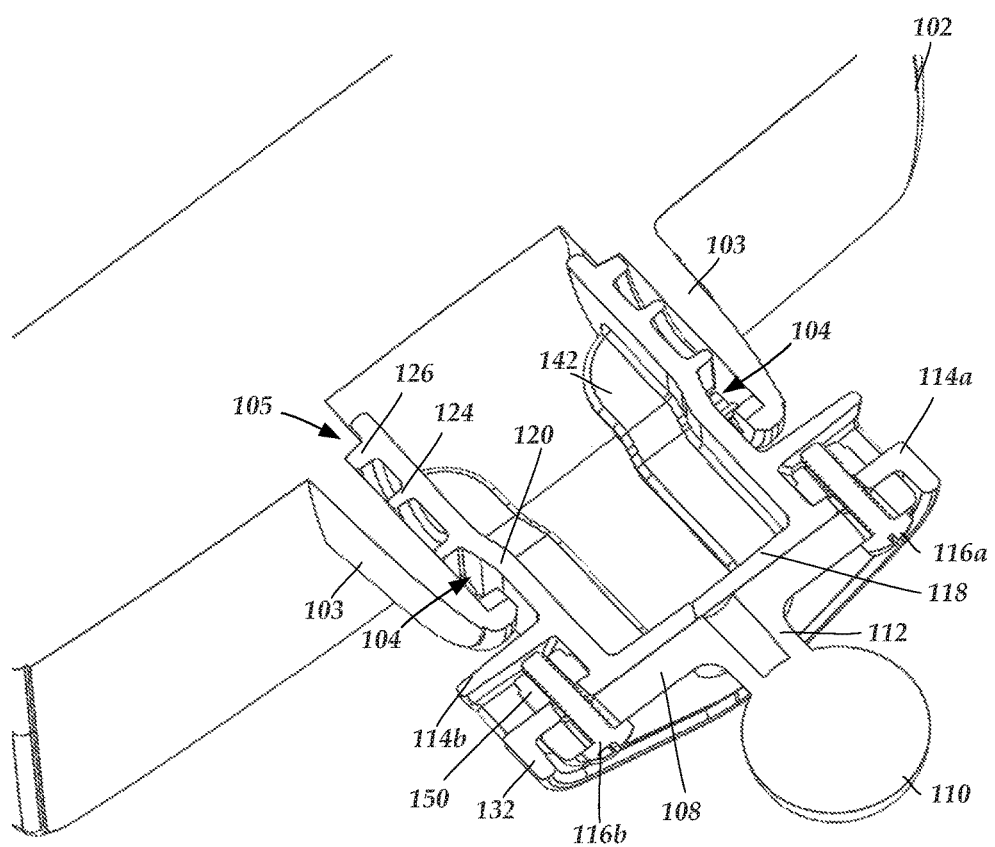
FIG. 2G is a schematic cross-sectional view of the mounting arrangement and the device, according to the invention.

In FIG. 2E, the base 108 of the mount 106 is presented to the combined receiving platforms 118 of the two device engagement units 114a, 114b. In FIG. 2F, the base 108 is attached to the combined receiving platforms 118 of the two device engagement units 114a, 114b using the fasteners 116a, 116b to complete the attachment of the mounting arrangement 100 to the device 102. FIG. 2G is a cross-sectional view of the mounting arrangement 100 and the device 102.

Returning to FIG. 1, in at least some embodiments, the ball 110 of the mount 106 is configured so that it can be received by a clamp, socket arm arrangement (such as those available from National Products Inc, Seattle, Wash.), or other device for mounting on or in a vehicle (for example, boat, car, truck, or the like), tripod, rail, or any other suitable surface or object. In at least some embodiments, the ball 110 has an outer surface that is made of a resilient material that can be compressed to grip to the ball and maintain the mounting arrangement 100 at a selected orientation. For example, the ball 110 may include a metal interior that is coated or otherwise covered with a rubbery or resilient material. The neck 112 can be an extension of the ball 110 or can be a separate component that couples the ball to the base 108.

The base 108 of the illustrated embodiment is diamond-shaped, but it will be understood that the base can be any suitable shape including, but not limited to, square rectangular, circular, oval, triangular, hexagonal, octagonal, or the like. In the illustrated embodiments, the base 108 is plate-like, but it will be understood that other suitable bases can have other three-dimensional shapes. The base 108 and neck 112 can be made of any suitable material including, but not limited to, metal, rigid plastic, or the like or any combination thereof.

In at least some embodiments, the base 108 includes two or more openings 122 for fastening the base to the two device engagement units 114a, 114b using the two fasteners 116a, 116b. The fasteners 116a, 116b can be screws, bolts, pins, or the like or any other suitable fastener. Alternatively or additionally, the base 108 can include pins or other protrusions (not shown) that can be received by openings 130 (FIG. 2D) in the two device engagement units 114a, 114b to couple the base to the two device engagement units 114a, 114b. Any other suitable arrangement (or combination of arrangements) can be used for coupling the base 108 to the two device engagement units 114a, 114b.

The two device engagement units 114a, 114b can be made of any suitable material including, but not limited to, metal, rigid plastic, or the like or any combination thereof.

As indicated above, each of the device engagement units 114a, 114b includes a receiving platform 118 and a leg 120 which contains a male socket engagement element 124 configured to engage the socket 104 of the device 102. The receiving platform 118 is configured to couple to the base 108 of the mount 106 and includes an opening 130 (FIG. 2D) for receiving one of the fasteners 116a, 116b. Alternatively or additionally, the receiving platform 118 can include pins or other protrusions (not shown) that can be received by the openings 122 in the base 108 to couple the base to the two device engagement units 114a, 114b. Any other suitable arrangement (or combination of arrangements) can be used for coupling the base 108 to the two device engagement units 114a, 114b.

In at least some embodiments, the combined receiving platforms 118 of the two device engagement units 114a, 114b have the same shape as the lateral cross-section of the base 108 of the mount 106 (for example, diamond-shaped, square rectangular, circular, oval, triangular, hexagonal, octagonal, or the like.) The combined receiving platforms 118 form receiving surface for the base 108.

In at least some embodiments, each of the device engagement units 114a, 114b also contains an optional rim 132 (FIG. 2D) extending away from the receiving platform 118 and around at least a portion of the perimeter of the receiving platform. In such embodiments, the combined receiving platforms 118 form an inset receiving surface for the base 108. In at least some of these embodiments, the rim 132 goes around the entire perimeter of the inset receiving surface. In at least some embodiments, when the base 108 of the mount 106 is coupled to the receiving platforms 118 of the device engagement units 114a, 114b, the base 108 is nested within, and surrounded by, the combined rim of the two device engagement units. In at least some embodiments, a height of the rim 132 above the inset receiving surface is equal to, less than, or greater than an average thickness of the base 108.

In at least some embodiments, the receiving platform 118 of at least one (or even both) of the device engagement units 114a, 114b includes one or more tabs 134 (FIG. 2D) along an edge where the receiving platforms of the two device engagement units 114a, 114b meet. In such embodiments, the receiving platform 118 of at least one (or even both) of the device engagement units 114a, 114b includes one or more recesses 136 (FIG. 2D) into which the tab(s) can fit. The tab(s) 134 and recess(es) 136 can facilitate alignment of the two device engagement units 114a, 114b. In the illustrated embodiment, one device engagement unit 114a includes a tab 134 and the other device engagement unit 114b includes a recess 136. In other embodiments, a device engagement unit can include two or more tabs, two or more recesses, or any combination of tabs and recesses with the other device engagement unit including the opposite arrangement of tab(s), recess(es), or combination thereof.

In at least some embodiments, a housing 138 (FIG. 2D) may be formed beneath the receiving platform 118 of each of the device engagement units 114a, 114b to surround, and provide access through an opening 140, to the distal end of the fasteners 116a, 116b and any nut 150 (FIG. 2G) or other component disposed on the fastener. The housing 138 may be provided to retain the nut 250 (or other component) within the device engagement unit 114a, 114b, to prevent damage or injury from sharp corners of the nut or other component, for aesthetics, or for any other suitable reasons or combination of reasons.

The leg 120 of each device engagement unit 114a, 114b extends away from the receiving platform 118. In some embodiments, one or more ribs 142 (FIG. 1) may extend along each leg 120 to provide, for example, mechanical support or stability to the leg 120.

Returning to FIG. 1, the leg 120 of each device engagement unit 114a, 114b includes a male socket engagement element 124 that includes teeth 126 for engaging the teeth 105 of the socket 104 of the device 102. In the illustrated embodiment, the teeth 126 are arranged along a rim 144 which coincides to at least a portion of the socket 104 of the device 102. In the illustrated embodiment, the teeth 126 are arranged with the same spacing as the teeth 105 of the socket 104, but the number of teeth 126 is fewer than the number of the teeth 105 of the socket 104. Thus, the teeth 126 will only alternate with a portion (i.e., fewer than all) of the teeth 105 of the socket 104 when the male socket engagement element 124 is engaged with the socket 104. Thus, the teeth 126 of the male socket engagement element 124 only alternate with the teeth 105 of the socket 104 along a portion (for example, no more than 20%, 25%, 30%, 34%, 40%, 50%, or 75%) of the perimeter of the socket 104. In other embodiments, the male socket engagement element and socket are arranged so that the teeth 126 alternate with the teeth 105 around the entire perimeter of the socket.

In the illustrated embodiment, the teeth 105 of the socket 104 and the teeth 126 of the device engagement units 114a, 114b are trapezoidal or triangular in cross-section, but it will be recognized that other cross-sectional shapes (for example, rectangular, square, hemispherical, rounded, or the like) can be used. It will also be recognized that other types of socket and male socket engagement elements can be used in place of toothed sockets and toothed male socket engagement elements.

In at least some embodiments, the male socket engagement element 124 and socket 104 are arranged so that these two components can engage each other at multiple different rotational positions. Once engaged, however, the male socket engagement element 124 and socket 104 cannot rotate relative to each other unless the male socket engagement element 124 is disengaged from the socket 104. This arrangement provides a secure and stable mounting of the mounting arrangement 100 to the device 102 that can only be altered by disengaging the male socket engagement elements 124 of the two device engagement units 114a, 114b from the two sockets 104 of the device 102.

The above specification provides a description of the manufacture and use of the invention. Since many embodiments of the invention can be made without departing from the spirit and scope of the invention, the invention also resides in the claims hereinafter appended.

What is claimed as new and desired to be protected by Letters Patent of the United States is:

1. A mounting arrangement for coupling to a device having a pair of sockets, the mounting arrangement comprising:
   a mount comprising a base, a ball, and a neck coupling the ball to the base;
   two device engagement units, each of the device engagement units comprising a receiving platform and a leg extending from the receiving platform, each of the legs of the two device engagement units comprising a male socket engagement element configured to engage a different one of the sockets of the device; and
   two fasteners, each fastener configured to fasten the mount to a different one of the two device engagement units,
   wherein the mounting arrangement is configured for the base to be received by, and fastened to, both of the receiving platforms of the two device engagement units and for the base to form a wedge pushing the male socket engagement elements of the two device engagement units into engagement with the sockets of the device to non-rotatably secure the mounting arrangement to the device,
   wherein the receiving platforms of the two device engagement units combine to form an inset receiving surface for the base of the mount, wherein the two device engagement units further comprise a rim around a perimeter of the inset receiving surface, wherein the base and the inset receiving surface are both diamond-shaped.

2. The mounting arrangement of claim 1, wherein the male socket engagement element comprises a plurality of teeth configured to engage and alternate with teeth of the sockets of the device.

3. A mounting arrangement for coupling to a device having a pair of sockets, the mounting arrangement comprising:
   a mount comprising a base, a ball, and a neck coupling the ball to the base;
   two device engagement units, each of the device engagement units comprising a receiving platform and a leg extending from the receiving platform, each of the legs of the two device engagement units comprising a male socket engagement element configured to engage a different one of the sockets of the device; and
   two fasteners, each fastener configured to fasten the mount to a different one of the two device engagement units,
   wherein the mounting arrangement is configured for the base to be received by, and fastened to, both of the receiving platforms of the two device engagement units and for the base to form a wedge pushing the male socket engagement elements of the two device engagement units into engagement with the sockets of the device to non-rotatably secure the mounting arrangement to the device, wherein the receiving platform of at least one of the device engagement units comprises a tab and the receiving platform of at least one of the device engagement units comprises a recess configured to receive the tab.

4. The mounting arrangement of claim 3, wherein the receiving platforms of the two device engagement units combine to form an inset receiving surface for the base of the mount.

5. The mounting arrangement of claim 4, wherein the two device engagement units further comprise a rim around a perimeter of the inset receiving surface.

6. The mounting arrangement of claim 5, wherein the base and the inset receiving surface are both diamond-shaped.

7. The mounting arrangement of claim 5, wherein a height of the rim above the inset receiving surface is equal to or less than an average thickness of the base.

8. The mounting arrangement of claim 2, wherein the teeth are distributed around a portion of a perimeter of the male socket engagement element.

9. A mounting arrangement for coupling to a device having a pair of sockets, the mounting arrangement comprising:
   a mount comprising a base, a ball, and a neck coupling the ball to the base;
   two device engagement units, each of the device engagement units comprising a receiving platform and a leg extending from the receiving platform, each of the legs of the two device engagement units comprising a male socket engagement element configured to engage a different one of the sockets of the device; and
   two fasteners, each fastener configured to fasten the mount to a different one of the two device engagement units,
   wherein the mounting arrangement is configured for the base to be received by, and fastened to, both of the receiving platforms of the two device engagement units and for the base to form a wedge pushing the male socket engagement elements of the two device engagement units into engagement with the sockets of the device to non-rotatably secure the mounting arrangement to the device, wherein each of the device engagement units comprises a housing, an opening into the housing, and a nut disposed within the housing and configured to receive a one of the fasteners.

10. The mounting arrangement of claim 1, wherein the mount comprises two openings and each of the device engagement units comprises an opening in the receiving platform for alignment with one of the openings in the mount and for receiving a one of the fasteners.

11. The mounting arrangement of claim 1, wherein the ball comprises a resilient surface.

12. The mounting arrangement of claim 1, wherein a height of the rim above the inset receiving surface is equal to or less than an average thickness of the base.

13. The mounting arrangement of claim 3, wherein the male socket engagement element comprises a plurality of teeth configured to engage and alternate with teeth of the sockets of the device.

14. The mounting arrangement of claim 13, wherein the teeth are distributed around a portion of a perimeter of the male socket engagement element.

15. The mounting arrangement of claim 3, wherein each of the device engagement units comprises a housing, an opening into the housing, and a nut disposed within the housing and configured to receive a one of the fasteners.

16. The mounting arrangement of claim 3, wherein the mount comprises two openings and each of the device engagement units comprises an opening in the receiving platform for alignment with one of the openings in the mount and for receiving a one of the fasteners.

17. The mounting arrangement of claim 3, wherein the ball comprises a resilient surface.

18. The mounting arrangement of claim 1, wherein each of the device engagement units comprises a housing, an opening into the housing, and a nut disposed within the housing and configured to receive a one of the fasteners.

19. The mounting arrangement of claim 9, wherein the male socket engagement element comprises a plurality of teeth configured to engage and alternate with teeth of the sockets of the device.

20. The mounting arrangement of claim 19, wherein the teeth are distributed around a portion of a perimeter of the male socket engagement element.

* * * * *